United States Patent
McLeod et al.

(10) Patent No.: US 8,680,919 B2
(45) Date of Patent: Mar. 25, 2014

(54) IMPEDANCE ADJUSTMENTS IN AMPLIFIERS

(75) Inventors: Scott McLeod, San Jose, CA (US); Nikola Nedovic, San Jose, CA (US)

(73) Assignee: Fujitsu Limited, Kawasaki (JP)

( * ) Notice: Subject to any disclaimer, the term of this patent is extended or adjusted under 35 U.S.C. 154(b) by 8 days.

(21) Appl. No.: 13/429,206

(22) Filed: Mar. 23, 2012

(65) Prior Publication Data
US 2013/0249629 A1    Sep. 26, 2013

(51) Int. Cl.
*H03F 3/68* (2006.01)
(52) U.S. Cl.
USPC ............................................. 330/85; 330/308
(58) Field of Classification Search
USPC .......................................... 330/85, 308, 279
See application file for complete search history.

(56) References Cited

U.S. PATENT DOCUMENTS

| | | | |
|---|---|---|---|
| 6,809,596 B2 * | 10/2004 | Seetharaman et al. | 330/308 |
| 6,870,427 B2 * | 3/2005 | Cathelin et al. | 330/296 |
| 7,135,932 B2 | 11/2006 | Quadir et al. | |
| 7,239,207 B2 * | 7/2007 | Seetharaman et al. | 330/308 |
| 7,332,971 B2 | 2/2008 | Dasgupta et al. | |

* cited by examiner

*Primary Examiner* — Henry Choe
(74) *Attorney, Agent, or Firm* — Maschoff Brennan

(57) ABSTRACT

A circuit that includes an amplifier circuit with an input impedance due to an input resistance and an input capacitance of the amplifier circuit. The input impedance of the amplifier circuit may vary with frequency. The amplifier circuit may include an amplifier and a feedback circuit configured to provide feedback to the amplifier and to maintain the input impedance at a specified value at a selected frequency by increasing the input resistance of the amplifier circuit at the selected frequency.

20 Claims, 8 Drawing Sheets

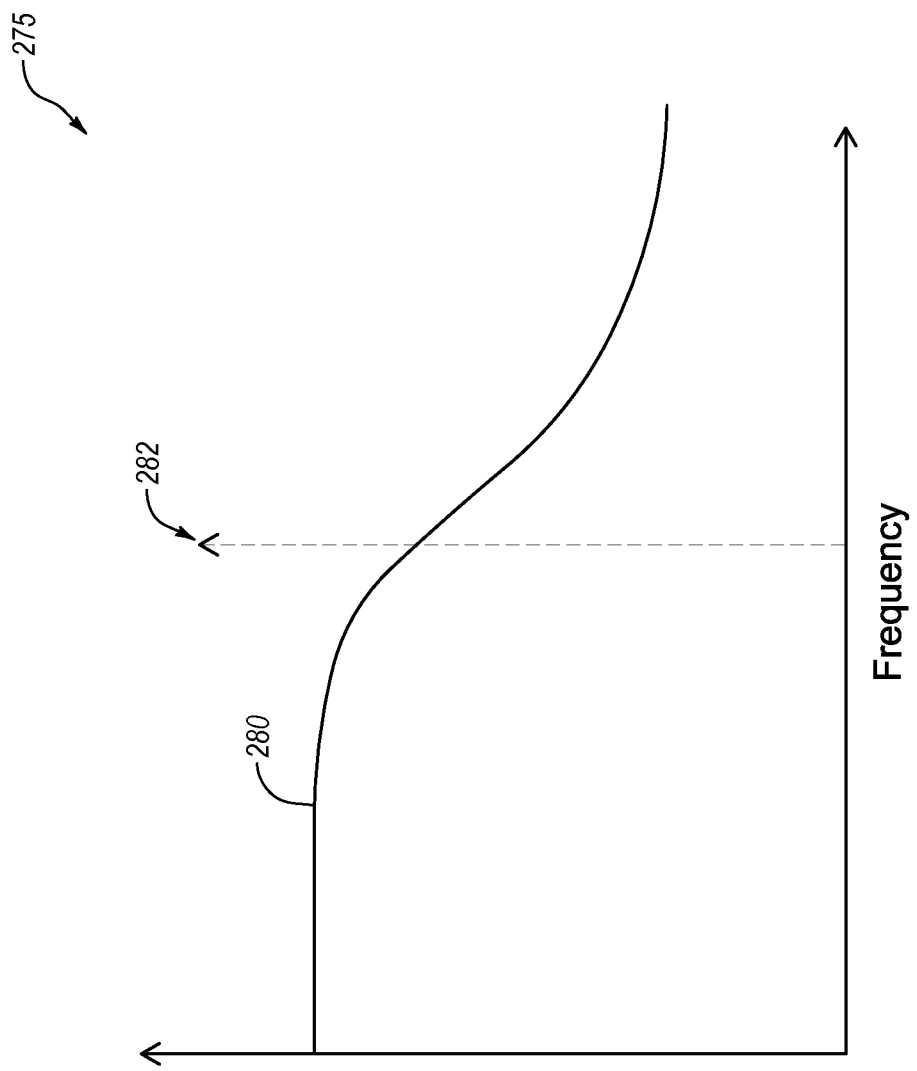

IMPEDANCE ADJUSTMENTS IN AMPLIFIERS

FIELD

The embodiments discussed herein are related to electrical circuits.

BACKGROUND

An optical receiver in an optical network may include a photodiode and a transimpedance amplifier. The photodiode may be exposed to the optical signal and may generate an electrical signal that represents the optical signal. The electrical signal may be converted from an electrical current to an electrical voltage using the transimpedance amplifier.

In some circumstances, the photodiode and the transimpedance amplifier may be connected by a package and/or a printed circuit board (PCB) trace. The package and/or PCB trace may have a specified impedance. An input impedance of the transimpedance amplifier may be manufactured to approximate the impedance of the package and/or PCB trace to reduce reflections of the electrical signal in the package and/or PCB trace. As signaling frequencies in optical networks increase, the bandwidth of the input of the transimpedance amplifier may be insufficient to maintain an input impedance up to the highest frequencies of the signal that approximates the impedance of a connected package and/or PCB trace. The difference in impedances between the package and/or PCB trace at these higher frequencies may result in increased reflections of electrical signals at the transimpedance amplifier and package and/or PCB trace interface.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a circuit includes an amplifier circuit with an input impedance due to an input resistance and an input capacitance of the amplifier circuit. The input impedance of the amplifier circuit may vary with frequency. The amplifier circuit may include an amplifier and a feedback circuit configured to provide feedback to the amplifier and to maintain the input impedance at a specified value at a selected frequency by increasing the input resistance of the amplifier circuit at the selected frequency.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which:

FIGS. 2B and 2C are graphs that illustrate various characteristics of the amplifier circuit of FIG. 1;

DESCRIPTION OF EMBODIMENTS

Some embodiments described herein include an amplifier that has input impedance that is frequency dependent. In some embodiments, the input impedance of the amplifier may be dependent on an input capacitance and an input resistance of the amplifier. Both the input capacitance and the input resistance may be frequency dependent as well. In some embodiments, the amplifier may be configured to maintain its input impedance at a specified level over a frequency bandwidth larger than a frequency bandwidth of an input impedance of other amplifiers. Maintaining the input impedance at a specified level over the larger frequency bandwidth may reduce signal reflections generated at an interface between a PCB trace or package and the amplifier. The amplifier may be configured to maintain its input impedance over the larger frequency bandwidth by increasing its input resistance at frequencies at which the input capacitance decreases to levels that appreciably change the input impedance of the amplifier. In some embodiments, the amplifier may increase its input resistance by reducing a feedback gain of a feedback circuit internal to the amplifier.

Embodiments of the present invention will be explained with reference to the accompanying drawings.

Figure 1:
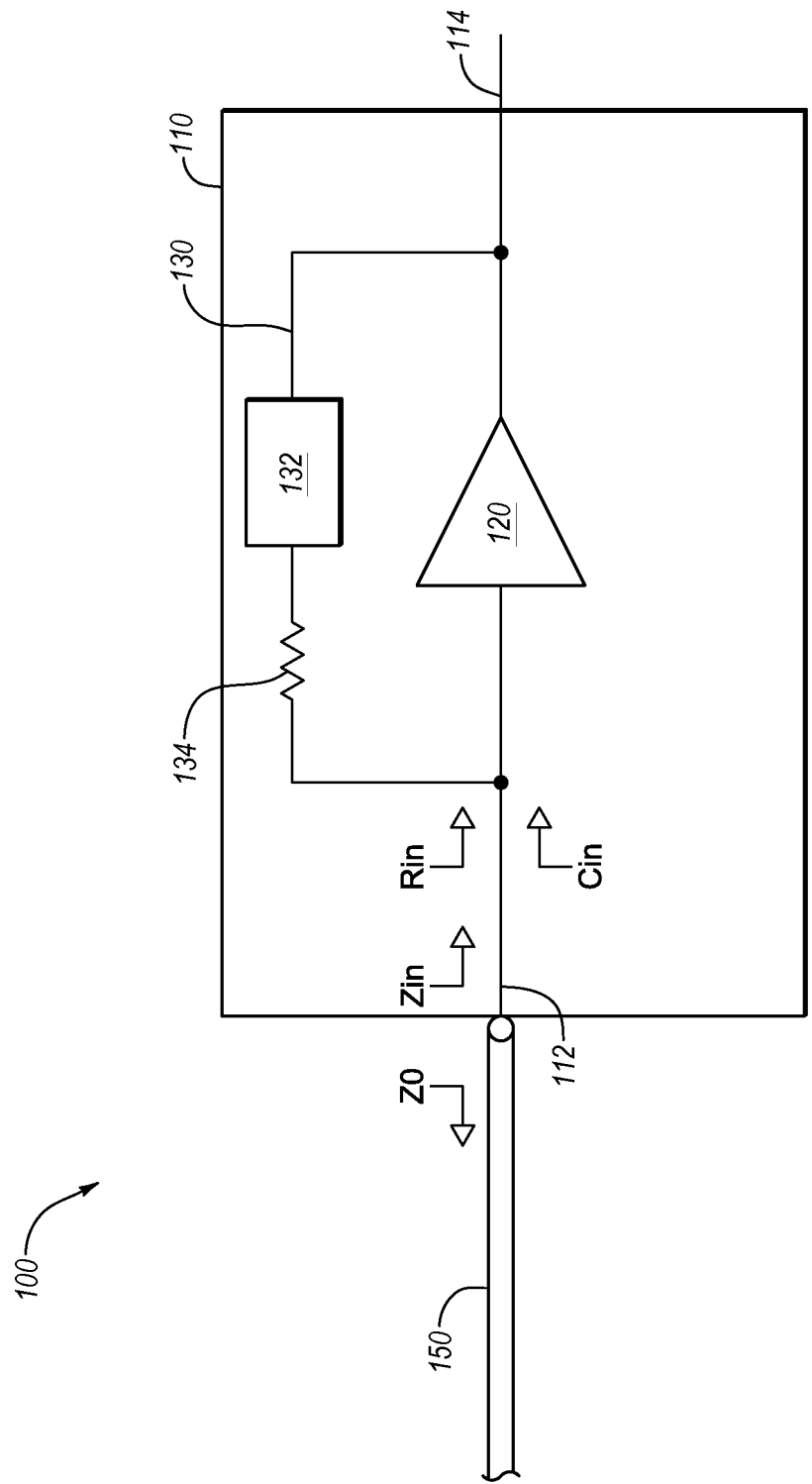
FIG. 1 illustrates an example circuit with an amplifier circuit.

FIG. 1 illustrates an example circuit 100 with an amplifier circuit 110, arranged in accordance with at least some embodiments described herein. The circuit 100 may include a trace 150 that is coupled to an input node 112 of the amplifier circuit 110. The amplifier circuit 110 may include an amplifier 120 between the input node 112 and an output node 114. The amplifier 120 may further include a feedback circuit 130 between the input node 112 and the output node 114 that includes a circuit element 132 and a feedback resistor 134. The feedback circuit 130 may be configured to provide feedback to the amplifier 120.

The amplifier circuit 110 may have an input impedance Zin as seen from the input node 112 that varies with frequency. In some embodiments, the input impedance Zin may be due to a combination of an input capacitance Cin and an input resistance Rin of the amplifier circuit 110 as seen from the input node 112. As such, the input impedance Zin may be affected by an increase or decrease of either or both of the input capacitance Cin and the input resistance Rin.

In some embodiments, the input capacitance Cin may include a combination of the inherent capacitances of the circuit elements within the amplifier circuit 110 as well as parasitic capacitances at the input node 112. The input resistance Rin may include the inherent resistances of the circuit elements within the amplifier circuit 110. In some embodiments, the input resistance Rin and the input capacitance Cin may be dependent on frequency. Thus, the magnitudes of the input resistance Rin and the input capacitance Cin may vary over the frequency bandwidth of a signal received by the amplifier circuit 110. The relationship between the input impedance Zin and the impedances of the input capacitance Cin and of the input resistance Rin may be represented by the following:

$$Zin(s)=Rin(s)\|Cin(s)=(Rin(s)*Cin(s))/(Rin(s)+Cin(s)),$$

where Zin(s) is the input impedance, Rin(s) is the impedance of the input resistance, Cin(s) is the impedance of the input capacitance, and "s" represents frequency.

At low frequencies, such as frequencies near zero, a magnitude of the input capacitance Cin may be multiple orders of magnitude larger than a magnitude of the input resistance Rin. As a result, changes in magnitude of the input capacitance Cin may result in non-appreciable changes in the input impedance Zin. For example, non-appreciable changes in the input impedance Zin may be changes that result in less than a 1% change in the input impedance Zin at low frequencies, such as zero. For example, in some embodiments, a magnitude of the input resistance Rin may be selected as 50 Ohms at a frequency of zero and a magnitude of the frequency-dependent input capacitance Cin may be selected as 1,000,000 Ohms at a frequency of zero. Due to a change in frequency, the magnitude of the input capacitance Cin may change to 500,000 Ohms. This change in the magnitude of the input capacitance Cin may result in the magnitude of the input impedance Zin changing by 0.001% from the value of the input impedance Zin at a frequency of zero. A 0.001% change in the input impedance Zin may be a non-appreciable change.

At certain frequency levels, the magnitude of the input capacitance Cin may begin to appreciably affect the input impedance Zin of the amplifier circuit 110. For example, in some embodiments, when the magnitude of the input capacitance Cin is reduced to within an order of magnitude of the magnitude of the input resistance Rin, the Cin may begin to appreciably affect the input impedance Zin of the amplifier circuit 110. As a result, the magnitude of the input impedance Zin of the amplifier circuit 110 may decrease at these frequencies and continue decreasing as the frequency increases.

In some embodiments, the amplifier circuit 110 may be designed to have its input impedance Zin be approximately equal to an impedance Z0 of the trace 150 at low frequencies. For example, in some embodiments, the impedance Z0 of the trace 150 may be set at 50, 75, 100 Ohms, or at some other value. When the input impedance Zin of the amplifier circuit 110 begins to decrease at higher frequencies, the input impedance Zin may no longer approximate the impedance Z0 of the trace 150. For example, in some embodiments, the higher frequencies may include frequencies greater than 1 gigahertz. Alternately or additionally, higher frequencies may include frequencies greater than 100 megahertz, 200 megahertz, 500 megahertz, 2 gigahertz, 5 gigahertz, 10 gigahertz, or another frequency.

In some embodiments, differences between the input impedance Zin and the impedance Z0 may result in signal reflections occurring at the intersection of the trace 150 and the amplifier circuit 110 when signals are sent along the trace 150 to the amplifier circuit 110. The larger the difference between the input impedance Zin and the impedance Z0, the larger the signal reflections that may occur. Signal reflections may result in degradation of a signal and signal loss.

In some embodiments, the amplifier circuit 110 may be configured to extend the bandwidth of the input impedance Zin, that is, to maintain the input impedance Zin at a magnitude approximately equal to the magnitude of the input impedance Zin at low frequencies. The amplifier circuit 110 may be configured to extend the bandwidth of the input impedance Zin by increasing the input resistance Rin at frequencies at which the input capacitance Cin begins to appreciably affect the input impedance Zin. Increasing the input resistance Rin may compensate, either in whole or in part, for the reduction in the input capacitance Cin and may maintain the input impedance Zin at a magnitude of the input impedance Zin at low frequencies.

In some embodiments, the input resistance Rin may be increased at a selected frequency by reducing a feedback gain of the feedback circuit 130 in the amplifier circuit 110 at the selected frequency. The input resistance Rin and the feedback gain of the feedback circuit 130 may have a relationship of Rin=R/(1+A) where A is the feedback gain and R is a resistance in the feedback circuit 130, such as the resistance of the feedback resistor 134. As indicated by the equation, to increase the input resistance Rin, the feedback gain is reduced.

The type of circuit element 132 and a value of the impedance of the circuit element 132 may be selected to reduce the feedback gain of the feedback circuit 130 in the amplifier circuit 110 at the selected frequency. In some embodiments, the circuit element 132 may be a frequency-dependent circuit element. As a frequency-dependent circuit element, the value of the impedance of the circuit element 132 may vary based on the frequency of a signal within the amplifier circuit 110. For example, at lower frequencies, the circuit element 132 may have a constant impedance and thus a constant effect on the feedback gain. At higher frequencies, and in particular, at the selected frequency, the impedance of the circuit element 132 may change and produce a reduction in the feedback gain of the feedback circuit 130. Thus, in some embodiments, the feedback circuit 130 may be configured to maintain the magnitude of the input impedance Zin, at the selected frequency, equal to the magnitude of the input impedance Zin, at low frequencies, by increasing the input resistance Rin of the amplifier circuit 110 at the selected frequency.

In some embodiments, as the feedback gain is reduced, the input resistance Rin of the amplifier circuit 110 increases. The impedance of the circuit element 132 may be selected so that the increase in the input resistance Rin compensates for the decrease in the input capacitance Cin, resulting in the ability to maintain the magnitude of the input impedance Zin at higher frequencies than would otherwise be possible. By maintaining the magnitude of the input impedance Zin at higher frequencies, fewer signal reflections may be generated at the intersection of the trace 150 and the input node 112. Fewer reflections may allow higher frequency signals to be transmitted along the trace 150 and through the amplifier circuit 110 with less signal loss.

In some embodiments, the input resistance Rin may be selected to cause the input impedance Zin of the amplifier circuit 110 to match a specified value, such as a value of the impedance Z0 of the trace 150, at a first frequency. Alternately or additionally, an impedance of the circuit element 132 within the feedback circuit 130 may be selected to reduce the feedback gain of the feedback circuit 130 at a second frequency that is greater than the first frequency. The reduction of the feedback gain of the feedback circuit 130 may be such that the input impedance Zin of the amplifier circuit 110 at the second frequency may approximately match the specified value. Alternately or additionally, a magnitude of the impedance within the feedback circuit may be adjusted to adjust a value of the second frequency.

In some embodiments, the input resistance Rin of the amplifier circuit 110 may begin to increase at the frequency at which the input capacitance Cin begins to appreciably affect the input impedance Zin. In other embodiments, the input resistance Rin of the amplifier circuit 110 may begin to increase at frequencies higher or lower than the frequency at which the input capacitance Cin begins to appreciably affect the input impedance Zin. The frequency that is selected for the input resistance Rin to begin to increase may depend on many factors, such as, the rate of increase and decrease of the input resistance Rin, the magnitude of the input capacitance Cin, the circuit's 100 tolerance for signal reflections, the amount of bandwidth expansion desired for the input impedance Zin, other factors, and the trade-offs between these factors. For example, the bandwidth of the input impedance Zin may be increased by increasing the frequency at which the input resistance Rin increases. However, by increasing the frequency at which the input resistance Rin increases, relatively larger signal reflections may occur at frequencies near the frequency at which the input capacitance Cin decreases than at frequencies further from the frequency at which the input capacitance Cin decreases.

In some embodiments, the circuit element 132 may have a capacitance. The capacitance of the circuit element 132 may be obtained from one or more capacitors or other circuit elements that have impedance that may be affected by frequency and produce the desired effect. In other embodiments, a combination of multiple circuit elements may be used to produce the desired effect.

Different configurations and combinations of circuit elements than those shown may be used within the amplifier circuit 110 and circuit 100. For example, in some embodiments, the amplifier circuit 110 may include additional circuit elements on the output node 114. In some embodiments, the amplifier 120 may be an inverting or non-inverting amplifier. In some embodiments, the amplifier 120 may have an op-amp configuration. In other embodiments, the amplifier 120 may have a different type of configuration. In some embodiments, the trace 150 may be a package or some other element that carries a signal to the amplifier circuit 110. In some embodiments, the amplifier circuit 110 may be a transimpedance amplifier. In these and other embodiments, the circuit 100 may be part of an optical receiver and may be configured to receive current signals representing optical signals received from an optical network.

Figure 2A:
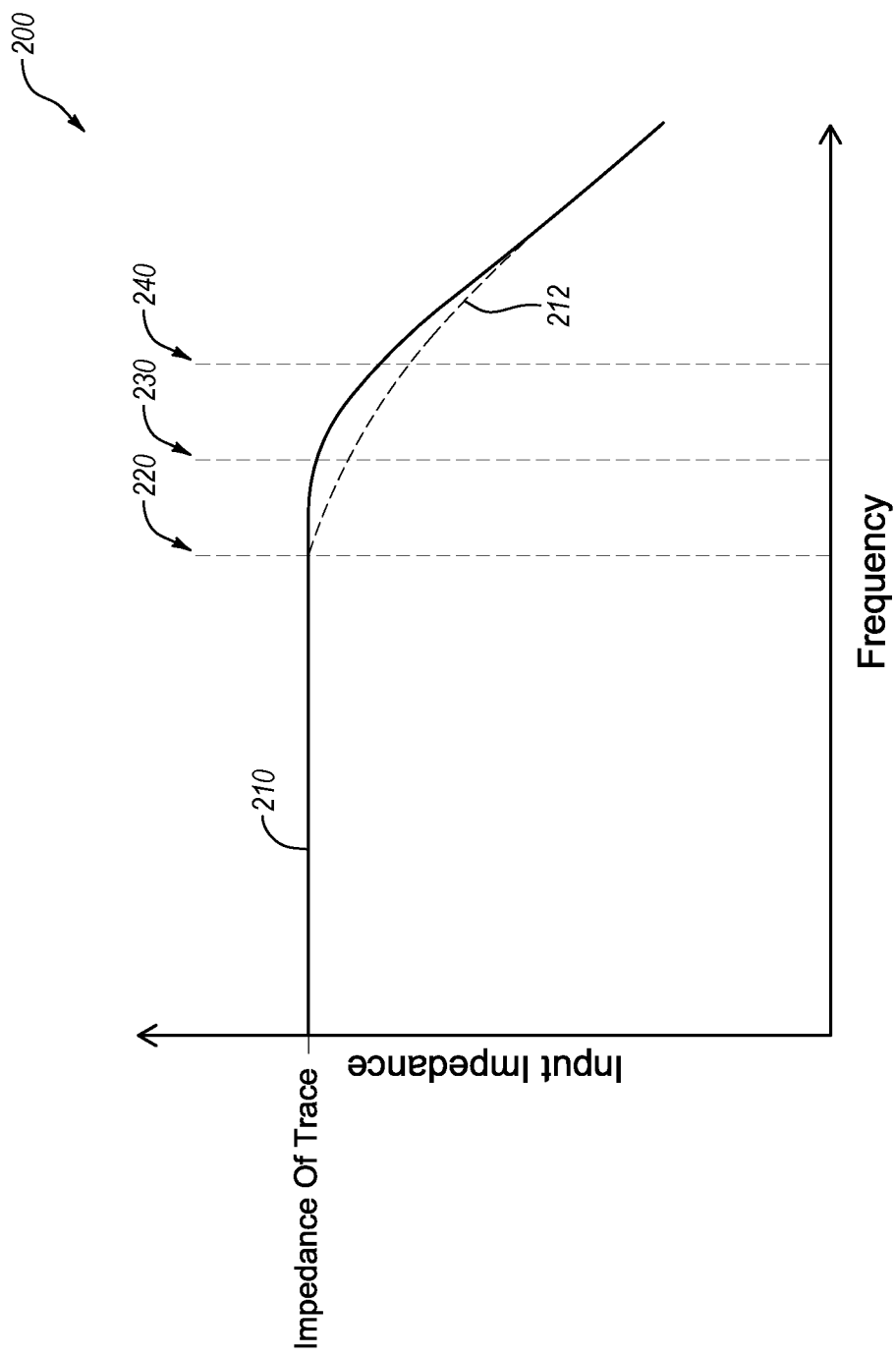
FIG. 2A is a graph of input impedance over frequency of the amplifier circuit of FIG. 1.

FIG. 2A is a graph 200 of input impedance over frequency of the amplifier circuit 110 of FIG. 1, arranged in accordance with at least some embodiments described herein. The graph 200 has an x-axis that represents a frequency of a signal transmitted over the trace 150 and within the amplifier circuit 110. The y-axis represents a magnitude of the input impedance Zin of the amplifier circuit 110. The line 210 represents a magnitude of the input impedance Zin of the amplifier circuit 110 with respect to frequency when the amplifier circuit 110 is configured to extend the bandwidth of the input impedance Zin. The line 212 represents a magnitude of the input impedance Zin of the amplifier circuit 110 with respect to frequency when the amplifier circuit 110 is not configured to extend the bandwidth of the input impedance Zin.

At a first frequency 220, the magnitude of the input capacitance Cin of the amplifier circuit 110 may begin to appreciably affect the input impedance Zin. If the amplifier circuit 110 does not compensate for the decrease in the input capacitance Cin, then the input impedance Zin may decrease as illustrated by line 212. When the amplifier circuit 110 compensates for the decrease in the input capacitance Cin, then the bandwidth of the input impedance Zin may be extended as illustrated by line 210. In particular, as illustrated in FIG. 2A, the bandwidth of the input impedance Zin may be extended to a second frequency 230 before the input impedance Zin begins to decrease.

In some embodiments, after the input impedance Zin begins to decrease, having compensated for the decrease in the input capacitance Cin may result in less of an input impedance Zin decrease at higher frequencies. For example, at a third frequency 240, the input impedance Zin may be relatively higher if compensation is performed for the decrease in the input capacitance Cin than if no compensation for the decrease in the input capacitance Cin is performed. Having less of an input impedance Zin decrease may result in less signal reflections and less signal loss at these higher frequencies than may otherwise occur if no compensation for the decrease in the input capacitance Cin is performed.

Figure 2B:
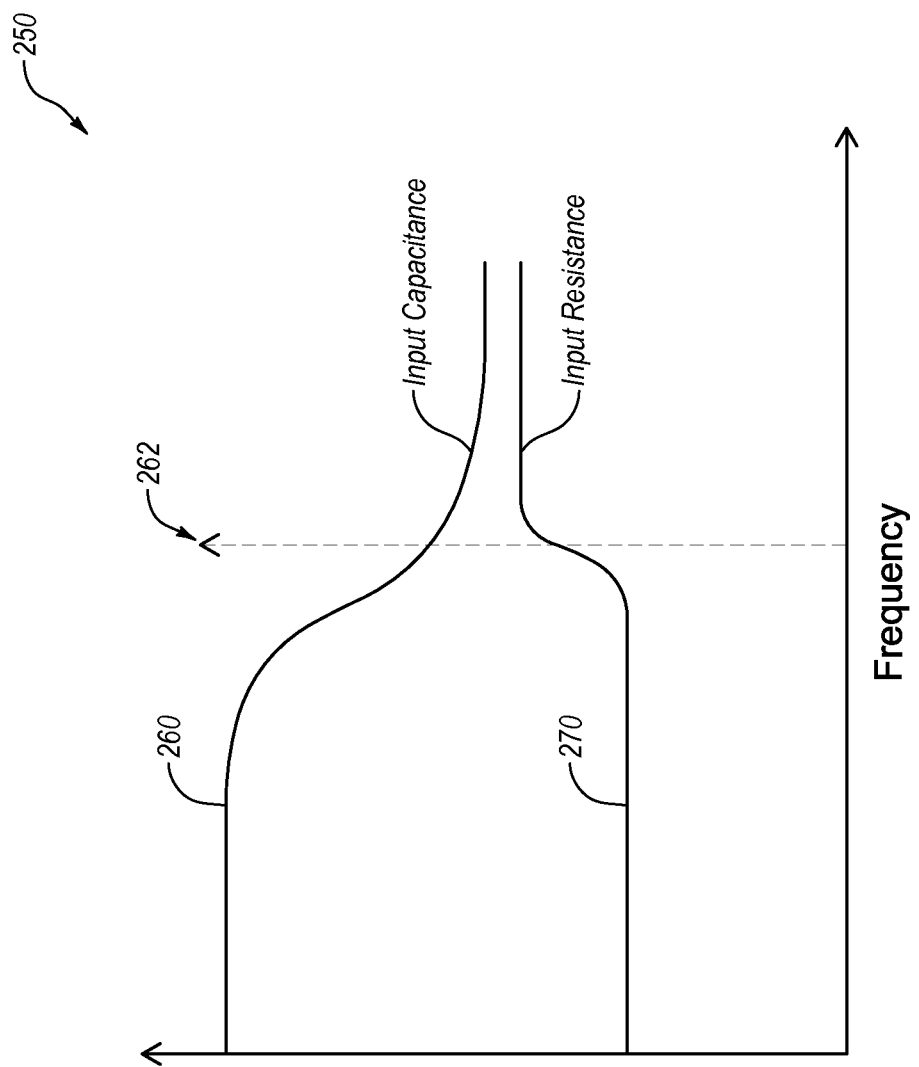

FIG. 2B is a graph 250 that illustrates various characteristics of the amplifier circuit of FIG. 1, arranged in accordance with at least some embodiments described herein. The graph 250 has an x-axis that represents a frequency of a signal transmitted over the trace 150 and within the amplifier circuit 110. A line 260 represents a magnitude of the input capacitance Cin of the amplifier circuit 110 with respect to frequency. A line 270 represents a magnitude of the input resistance Rin of the amplifier circuit 110 with respect to frequency.

The graph 250 illustrates that the magnitude of the input capacitance Cin varies with frequency. Furthermore, the graph 250 illustrates that the magnitude of the input capacitance Cin is reduced to within an order of magnitude of the magnitude of the input resistance Rin at a frequency 262, which may be the first frequency 220 of FIG. 2A. Additionally, the graph 250 illustrates that the magnitude of the input resistance Rin is configured to increase at the frequency 262.

FIG. 2C is a graph 275 that illustrates various characteristics of the amplifier circuit 110 of FIG. 1, arranged in accordance with at least some embodiments described herein. The graph 275 has an x-axis that represents a frequency of a signal transmitted over the trace 150 and within the amplifier circuit 110. A line 280 represents a magnitude of the feedback gain of the feedback circuit 130 with respect to frequency. The graph 275 illustrates that the feedback gain of the feedback circuit 130 is reduced at a frequency 282, which may be the first frequency 220 of FIG. 2A.

Figure 3:
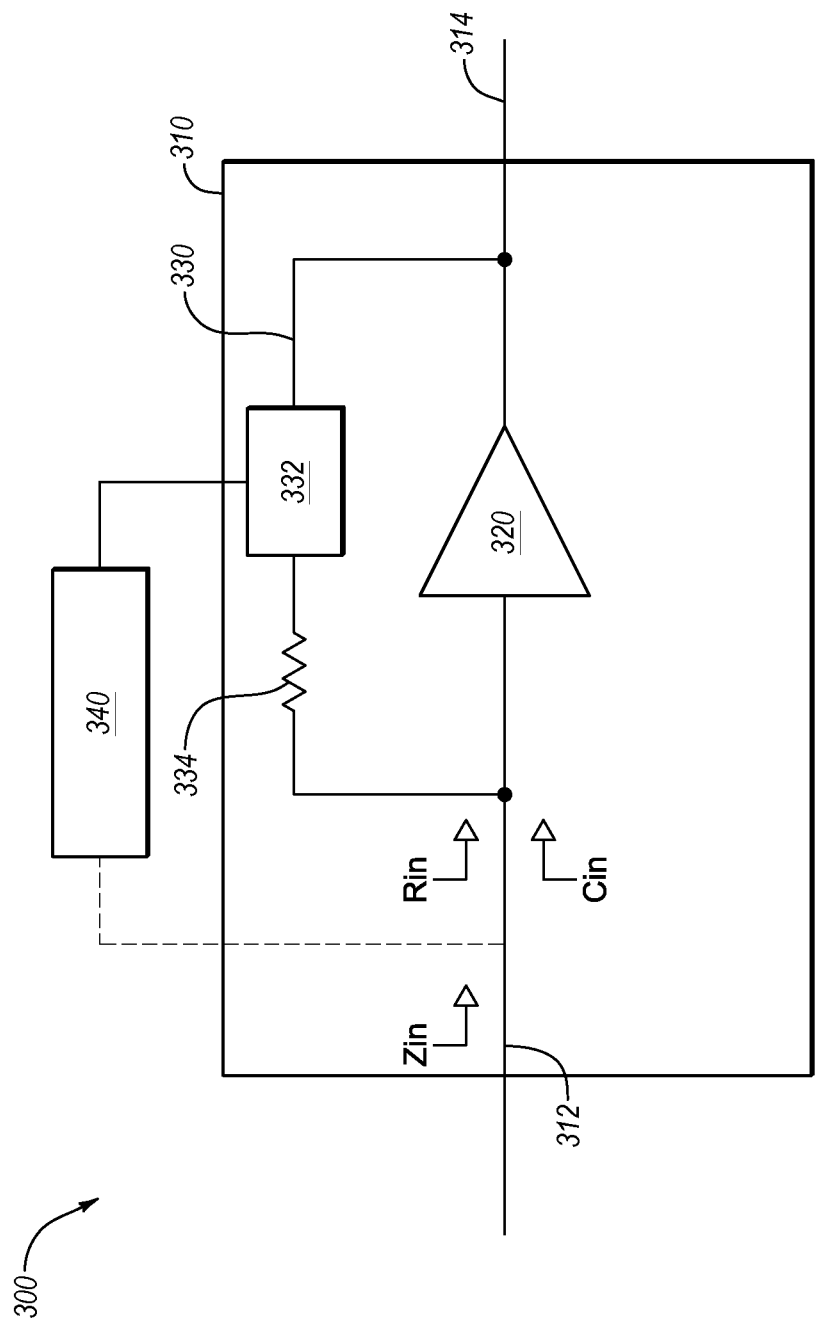
FIG. 3 illustrates another example circuit with an amplifier circuit.

FIG. 3 illustrates another example circuit 300 with an amplifier circuit 310, arranged in accordance with at least some embodiments described herein. The circuit 300 may include a controller 340 that is coupled to the amplifier circuit 310. The amplifier circuit 310 may include an amplifier 320 between the input node 312 and an output node 314. The amplifier 320 may further include a feedback circuit 330 between the input node 312 and the output node 314 that includes a circuit element 332 and a feedback resistor 334.

The amplifier circuit 310 may have an input impedance Zin as seen from the input node 312. In some embodiments, the input impedance Zin may include a combination of an input capacitance Cin and an input resistance Rin as seen from the input node 312 of the amplifier circuit 310. In some embodiments, the input capacitance Cin may include a combination of the inherent capacitances of the circuit elements within the amplifier circuit 310 as well as parasitic capacitance at the input node 312. The input resistance Rin may include the inherent resistance of the circuit elements within the amplifier circuit 310. In some embodiments, the input resistance Rin and the input capacitance Cin may be dependent on frequency.

In some embodiments, the amplifier circuit 310 may be configured to extend the bandwidth of the input impedance Zin by decreasing a feedback gain of the feedback circuit 330 at a selected frequency to increase the input resistance Rin of the amplifier circuit 310.

In some embodiments, the controller 340 may be configured to control an impedance of the circuit element 332 and thereby control the frequency at which the feedback gain is decreased and the input resistance Rin is increased. For example, in some embodiments, the amplifier circuit 310 may be in a system that handles signals of multiple frequencies. The controller 340 may adjust the impedance of the circuit element 332 based on the frequency of the signal. For example, in some embodiments, the amplifier circuit 310 may be part of an optical receiver that is compatible with 2.5 gigahertz, 5 gigahertz, 10 gigahertz, and 25 gigahertz signals. In these and other embodiments, the controller 340 may adjust the impedance of the circuit element 332 based on the frequency of the signal that the amplifier circuit 310 is receiving.

In some embodiments, the controller 340 may control the impedance of the circuit element 332 by adjusting the impedance of the circuit element 332. For example, the circuit element 332 may be a variable capacitor and the controller 340 may adjust the capacitance of the variable capacitor. In some embodiments, the controller 340 may control the impedance of the circuit element 332 by switching in or out other similar circuit elements to increase the total impedance of the circuit element 332. For example, the amplifier circuit 310 may contain multiple banks of the same type of circuit elements. The controller 340 may switch in the different banks of circuit elements to reach a desired impedance.

In some embodiments, the controller 340 may control the impedance of the circuit element 332 based on the input capacitance Cin of the amplifier circuit 310. In these and other embodiments, the controller 340 may sense the input capacitance Cin of the amplifier circuit 310 and adjust the impedance of the circuit element 332 based on the changing input capacitance Cin of the amplifier circuit 310 and a frequency of a signal passing through the amplifier circuit 310.

In some embodiments, the controller 340 may be a simple switch that is controlled by another device or a human operator. In other embodiments, the controller 340 may include a processor, microprocessor, field programmable gate array (FPGA), logic circuits, or other logic device that may control the circuit element 332.

Figure 4A:
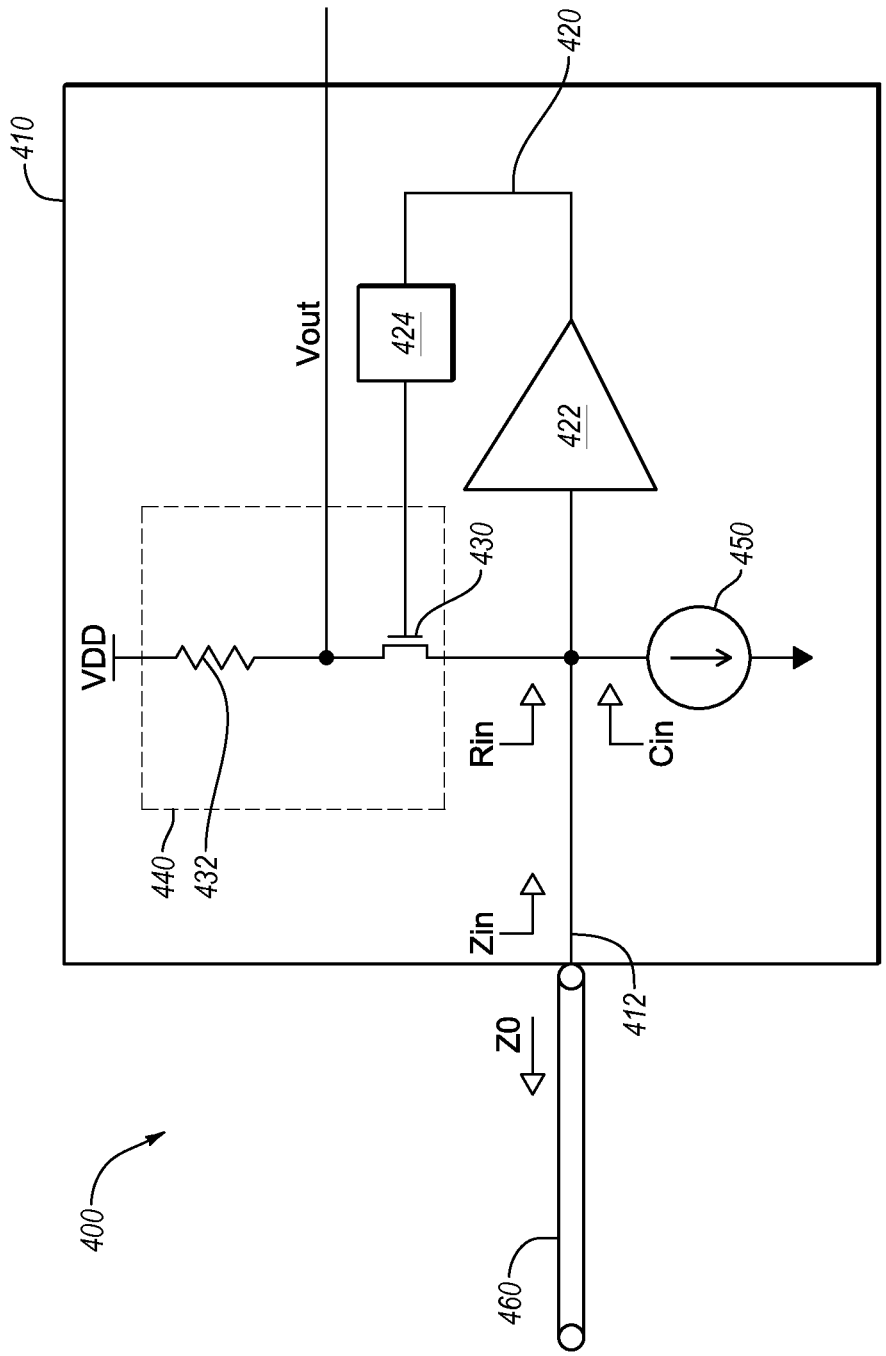
FIG. 4A illustrates another example circuit with an amplifier circuit.

FIG. 4A illustrates another example circuit 400 with an amplifier circuit 410, arranged in accordance with at least some embodiments described herein. The circuit 400 may include a trace 460 that is coupled to an input node 412 of the amplifier circuit 410. The input node 412 may be configured to receive a signal from the trace 460 and may be coupled to a biasing current circuit 450.

The amplifier circuit 410 may include a converting circuit 440 between the input node 412 and an output node Vout. In some embodiments, the converting circuit 440 may include a resistor 432 and a transistor 430. The resistor 432 may be coupled between the output node Vout and a supply voltage VDD. The transistor 430 may be coupled between the input node 412 and the output node Vout. The converting circuit 440 may be configured to convert a signal received by the input node 412 that is a current into a voltage. To convert a current into a voltage, the current may be received by the input node 412. Part of the current may be sunk in the biasing current circuit 450. The remaining portion of the current may pass through the transistor 430. A voltage is created between the supply voltage VDD and the output node Vout as the current passes through the resistor 432. The voltage created between the supply voltage VDD and the output node Vout is the output voltage on the output node Vout that represents the current received at the input node 412.

The amplifier circuit 410 may further include a feedback circuit 420 that includes an amplifier 422 and a circuit element 424. The feedback circuit 420 may be coupled between the input node 412 and the converting circuit 440, and in particular, may be coupled between the input node 412 and the transistor 430 within the converting circuit 440. The amplifier 422 may be coupled to the input node 412 and the circuit element 424 may be coupled between the converting circuit 440 and the amplifier 422. In some embodiments, the amplifier 422 may convert the current signal received at the input node 412 into a voltage. The feedback gain of the voltage generated by the amplifier 422 may be affected by the circuit element 424 and feed into a gate of the transistor 430.

The amplifier circuit 410 may have an input impedance Zin as seen from the input node 412. In some embodiments, the input impedance Zin may include a combination of an input capacitance Cin and an input resistance Rin as seen from the input node 412 of the amplifier circuit 410. As such, the input impedance Zin may be affected by an increase or decrease of either or both of the input capacitance Cin and the input resistance Rin.

In some embodiments, the input capacitance Cin may include a combination of inherent capacitances of the circuit elements within the amplifier circuit 410 as well as other parasitic capacitances at the input node 412. The input resistance Rin may include the inherent resistance of the circuit elements within the amplifier circuit 410. In some embodiments, the input resistance Rin and the input capacitance Cin may be dependent on frequency.

In some embodiments, the circuit element 424 may have an impedance that is frequency dependent. In these and other embodiments, the impedance within the feedback circuit 420 of the amplifier circuit 410 may be selected to reduce a feedback gain of the feedback circuit 420 at a frequency where a magnitude of the input capacitance Cin of the amplifier circuit 410 begins to appreciably affect the input impedance Zin. The reduction of the feedback gain of the feedback circuit 420 may increase the input resistance Rin of the amplifier circuit 410 and as a result, extend a bandwidth of the input impedance Zin of the amplifier circuit 410.

In some embodiments, the circuit element 424 may include a capacitor. In these and other embodiments, the capacitance of the capacitor may be selected based on the frequency at which the input resistance Rin is desired to be increased.

In some embodiments, the amplifier circuit 410 may be designed to have its input impedance Zin be approximately equal to an impedance Z0 of the trace 460 at low frequencies. The circuit element 424 and an impedance of the circuit element 424 may be selected so that at a frequency where a magnitude of the input capacitance Cin of the amplifier circuit 410 begins to appreciably affect the input impedance Zin, the input resistance Rin of the amplifier circuit 410 is increased. The input resistance Rin may be increased so that the input impedance Zin of the amplifier circuit 410 is maintained approximately equal to the impedance Z0 of the trace 460 at the frequency where the magnitude of the input capacitance Cin of the amplifier circuit 410 begins to appreciably affect the input impedance Zin and/or at higher frequencies.

Figure 4B:
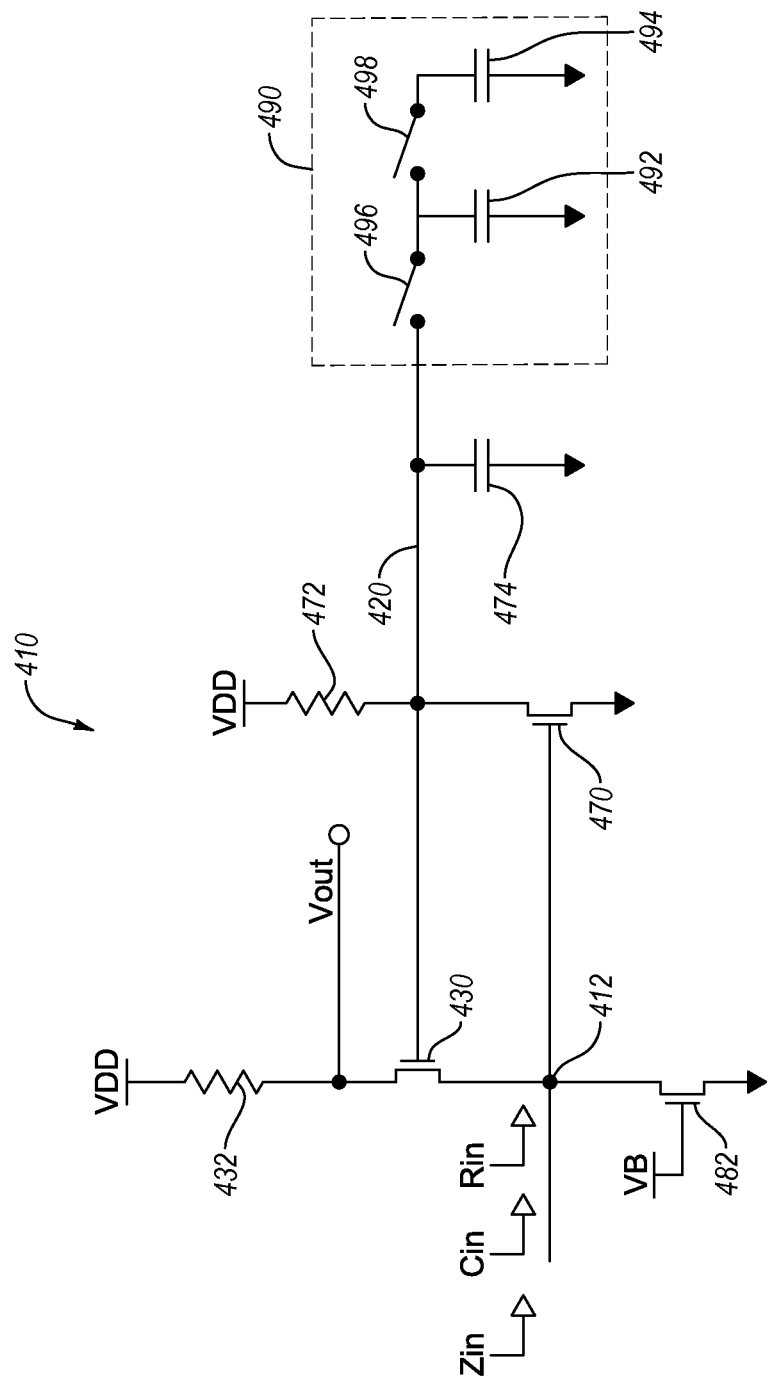
FIG. 4B illustrates an example of the amplifier circuit of FIG. 4A.

FIG. 4B illustrates an example of the amplifier circuit 410 of FIG. 4A at a transistor level, arranged in accordance with at least some embodiments described herein. In some embodiments, the biasing current circuit 450 may be a transistor 482 with its drain coupled to the input node 412 and its source coupled to ground. The gate of the transistor 482 may be coupled to a biasing voltage VB. In some embodiments, as illustrated in FIG. 4B, the amplifier 422 may be implemented with a transistor 470 and a resistor 472. The input node 412 may be coupled to the gate of the transistor 470. The source of the transistor 470 may be connected to ground and the drain of the transistor 470 may be connected to the gate of the transistor 430. The resistor 472 may be coupled between the drain of the transistor 470 and the supply voltage VDD.

The gate of the transistor 430 may also be connected to a capacitor 474. The capacitor 474 may act as the circuit element 424 within the feedback circuit 420 that reduces the feedback gain of the feedback circuit 420 and thereby affects the input impedance Zin of the amplifier circuit 410.

In some embodiments, the feedback gain of the feedback circuit 420 may be frequency dependent and may be dependent on the capacitance of the capacitor 474 as expressed by the following:

$A_f(s) = (g_{mf} R_{Lf})/(1 + s R_{Lf} C_X)$, where $A_f(s)$ is the frequency-dependent feedback gain of the feedback circuit 420, $g_{mf}$ is the transconductance of the transistor 470, $R_{Lf}$ is the value of the resistor 472, $C_X$ is the value of the capacitor 474, and "s" represents frequency.

In some embodiments, the input resistance of the amplifier circuit 410 may depend on the feedback gain $A_f(s)$ as expressed by the following:

$Rin(s) = (1/g_{mi})/(1 + A_f(s))$, where $Rin(s)$ is the frequency-dependent input resistance of the amplifier circuit 410 and $g_{mi}$ is the transconductance of the transistor 430.

In some embodiments, the relationship of the input impedance Zin to the input capacitance Cin and the input resistance Rin may be expressed by the following:

$Zin(s) = Rin(s) \| Cin(s) = (Rin(s) \ast Cin(s))/(Rin(s) + Cin(s))$, where $Zin(s)$ is the input impedance, $Cin(s)$ is the impedance of the input capacitance, and "s" represents frequency.

In these and other embodiments, the capacitance $C_X$ of the capacitor 474 may be selected so that the feedback gain $A_f(s)$ of the feedback circuit 420 decreases at a frequency equal to or greater than a frequency at which Cin(s) begins to appreciably affect the input impedance Zin. As the feedback gain $A_f(s)$ decreases, the input resistance Rin(s) increases. Increasing the input resistance Rin(s) may compensate, in whole or in part, for the decrease in the impedance of the input capacitance Cin(s) and may maintain the magnitude of the input impedance Zin(s) at frequencies at and surrounding the frequency at which the input capacitance Cin(s) begins to appreciably affect the input impedance Zin.

Optionally, the amplifier circuit 410 may contain a reconfiguration circuit 490 that may be used to adjust the capacitance on the feedback circuit 420. By adjusting the capacitance on the feedback circuit 420, the frequency at which the gain of the feedback is decreased may be adjusted. Accordingly, the frequency at which the input resistance Rin increases to affect the input impedance Zin of the amplifier circuit 410 may also be adjusted. In some embodiments, the reconfiguration circuit 490 may include switches 496, 498 and capacitors 492, 494. The switch 496 may switch the capacitor 492 into the feedback circuit 420 and both the switches 496, 498 may additionally switch the capacitor 494 into the feedback circuit 420. Once the capacitors 492, 494 are switched into the feedback circuit 420, they may act as a single circuit element that affects the feedback gain of the feedback circuit 420.

In some embodiments in FIGS. 4A and 4B, the transistors in the amplifier circuit 410 may be CMOS transistors, BJT transistors, or a combination of both. The above description references the gate, drain, and source of transistors 430, 470, and 482. The above description uses the nomenclature gate, drain, and source generically to represent different portions of a transistor. The use of the names gate, drain, and source may be used to describe generically the parts of a CMOS transistor or a BJT transistor.

Figure 5:
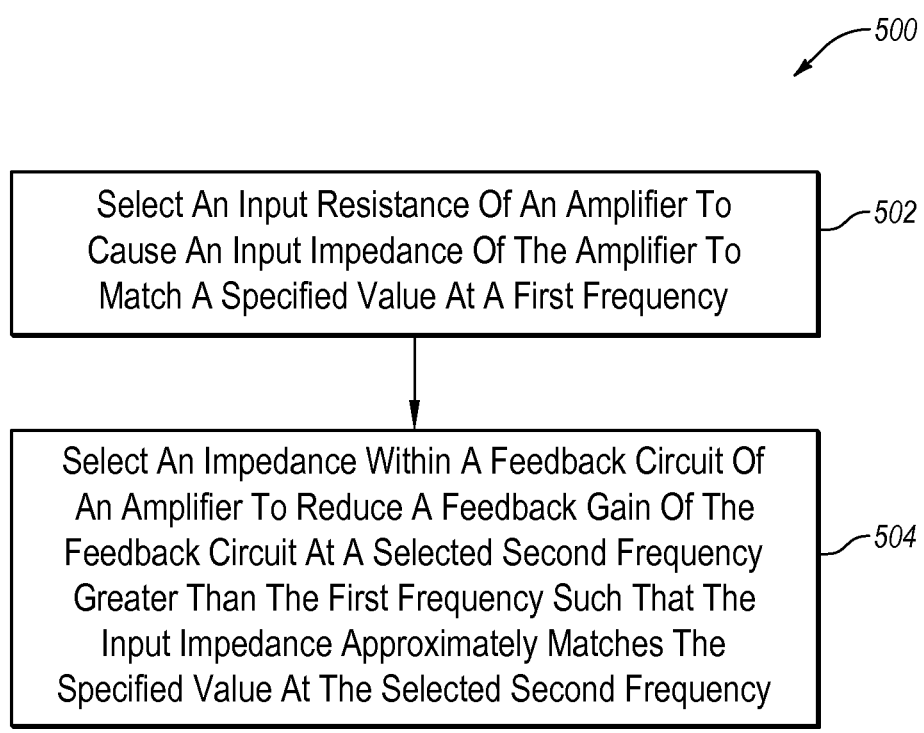
FIG. 5 is a flow chart of a method of adjusting an input impedance of an amplifier, all arranged in accordance with at least some embodiments described herein.

FIG. 5 is a flow chart of a method of adjusting an input impedance of an amplifier, arranged in accordance with at least one embodiment described herein. Although illustrated as discrete blocks, various blocks may be divided into additional blocks, combined into fewer blocks, or eliminated, depending on the desired implementation.

The method 500 may begin at block 502, where an input resistance of an amplifier may be selected to cause an input impedance of the amplifier to match a specified value at a first frequency.

In block 504, an impedance within a feedback circuit of an amplifier may be selected to reduce a feedback gain of the feedback circuit at a selected second frequency greater than the first frequency such that the input impedance approximately matches the specified value at the selected second frequency. In some embodiments, the impedance may include a capacitance. In some embodiments, reducing the feedback gain of the feedback circuit at the selected second frequency may extend a bandwidth of an input impedance of the amplifier. In some embodiments, a magnitude of an input capacitance of the amplifier, which affects the input impedance, may be reduced to within an order of magnitude of the magnitude of the input resistance at the selected second frequency.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments. For example, the method 500 may include adjusting a magnitude of the impedance within the feedback circuit to adjust the selected second frequency.

All examples and conditional language recited herein are intended for pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. An amplifier comprising:
   an input node configured to receive a signal;
   a converting circuit coupled to the input node, the converting circuit configured to receive the signal and to amplify the signal with an amplification greater than one; and
   a feedback circuit coupled to the input node and configured to amplify the signal by a feedback gain and feed the signal back to the converting circuit, the feedback gain configured to be reduced at a selected frequency to increase an input resistance of the amplifier such that a bandwidth of an input impedance of the amplifier is extended.

2. The amplifier of claim 1, wherein the amplifier has an input capacitance as seen at the input node that varies with frequency, wherein a magnitude of the input capacitance is reduced to within an order of magnitude of a magnitude of the input resistance at the selected frequency.

3. The amplifier of claim 1, wherein the converting circuit is configured to convert the signal from a current to a voltage.

4. The amplifier of claim 1, wherein the converting circuit comprises a transistor and a resistor.

5. The amplifier of claim 1, wherein the feedback circuit comprises a feedback amplifier and a frequency dependent circuit element configured to reduce the feedback gain of the feedback circuit at the selected frequency.

6. The amplifier of claim 5, wherein the frequency dependent circuit element is a capacitor.

7. The amplifier of claim 6, wherein the capacitor is a variable capacitor.

8. The amplifier of claim 6, wherein a capacitance of the capacitor is selected based on the selected frequency.

9. A circuit comprising:
the amplifier of claim 1; and
a trace, connected to the input node of the amplifier, having a trace impedance, the trace configured to transmit the signal to the input node, wherein the input impedance of the amplifier is approximately equal to the trace impedance at frequencies below and above the selected frequency.

10. A circuit comprising:
an amplifier circuit with an input impedance due to an input resistance and an input capacitance of the amplifier circuit, the input impedance varying with frequency, the amplifier circuit comprising:
an amplifier configured to receive a signal and to amplify the signal with an amplification greater than one; and
a feedback circuit configured to provide feedback to the amplifier and to maintain the input impedance at a specified value at a selected frequency by increasing the input resistance of the amplifier circuit at the selected frequency.

11. The circuit of claim 10, wherein the feedback circuit comprises a frequency dependent circuit element that reduces a feedback gain of the feedback circuit at the selected frequency, the reduction in the feedback gain causing the increase in the input resistance of the amplifier circuit.

12. The circuit of claim 11, wherein the frequency dependent circuit element is a capacitor.

13. The circuit of claim 12, wherein a capacitance of the capacitor is selected based on the selected frequency.

14. The circuit of claim 10, wherein the amplifier is a transimpedance amplifier.

15. A method of adjusting an input impedance of an amplifier, the method comprising:
selecting an input resistance of an amplifier to cause an input impedance of the amplifier to match a specified value at a first frequency; and
selecting an impedance within a feedback circuit of the amplifier to reduce a feedback gain of the feedback circuit at a selected second frequency greater than the first frequency such that the input impedance of the amplifier approximately matches the specified value at the selected second frequency.

16. The method of claim 15, wherein the impedance includes a capacitance.

17. The method of claim 15, further comprising adjusting a magnitude of the impedance within the feedback circuit to adjust the selected second frequency.

18. The method of claim 15, wherein reducing the feedback gain of the feedback circuit at the selected second frequency extends a bandwidth of the input impedance of the amplifier.

19. The method of claim 15, wherein a magnitude of an input capacitance of the amplifier, which affects the input impedance, is reduced to within an order of magnitude of the magnitude of the input resistance at the selected second frequency.

20. The method of claim 15, wherein the amplifier is a transimpedance amplifier.

* * * * *